(12) United States Patent
Milne et al.

(10) Patent No.: US 7,725,869 B1
(45) Date of Patent: May 25, 2010

(54) METHOD AND APPARATUS FOR MODELING MULTIPLE INSTANCES OF AN ELECTRONIC CIRCUIT USING AN IMPERATIVE PROGRAMMING LANGUAGE DESCRIPTION

(75) Inventors: Roger B. Milne, Boulder, CO (US); Haibing Ma, Superior, CO (US)

(73) Assignee: XILINX, Inc., San Jose, CA (US)

( * ) Notice: Subject to any disclaimer, the term of this patent is extended or adjusted under 35 U.S.C. 154(b) by 1448 days.

(21) Appl. No.: 11/101,075

(22) Filed: Apr. 7, 2005

(51) Int. Cl.
*G06F 17/50* (2006.01)

(52) U.S. Cl. .......................................... 716/17; 716/11

(58) Field of Classification Search .................. 717/104, 717/118; 716/1, 2, 3, 4, 13, 16, 18, 11, 17; 703/15
See application file for complete search history.

(56) References Cited

U.S. PATENT DOCUMENTS

| | | | | |
|---|---|---|---|---|
| 5,150,308 A | * | 9/1992 | Hooper et al. | 716/18 |
| 5,937,193 A | * | 8/1999 | Evoy | 717/140 |
| 6,226,776 B1 | * | 5/2001 | Panchul et al. | 716/3 |
| 6,378,122 B1 | * | 4/2002 | Levi et al. | 716/16 |
| 6,606,734 B2 | * | 8/2003 | Greaves | 716/4 |
| 6,883,147 B1 | * | 4/2005 | Ballagh et al. | 716/1 |
| 7,062,728 B2 | * | 6/2006 | Tojima | 716/3 |
| 7,085,702 B1 | * | 8/2006 | Hwang et al. | 703/15 |
| 7,143,388 B1 | * | 11/2006 | Miller et al. | 716/18 |
| 7,203,912 B2 | * | 4/2007 | Moona et al. | 716/3 |

* cited by examiner

*Primary Examiner*—Van H Nguyen
(74) *Attorney, Agent, or Firm*—Robert M. Brush; Lois D. Cartier

(57) ABSTRACT

Method and apparatus for modeling multiple instances of an electronic circuit using an imperative programming language description is described. In one example, a program is defined using an imperative programming language. The program includes multiple calls to a function. The function includes a persistent variable associated with an internal state of the electronic circuit. The function is configured to initialize the persistent variable based on at least one call path to the function in the program.

15 Claims, 4 Drawing Sheets

METHOD AND APPARATUS FOR MODELING MULTIPLE INSTANCES OF AN ELECTRONIC CIRCUIT USING AN IMPERATIVE PROGRAMMING LANGUAGE DESCRIPTION

FIELD OF THE INVENTION

One or more aspects of the present invention relate generally to electronic design of integrated circuits and, more particularly, to a method and apparatus for modeling multiple instances of an electronic circuit using an imperative programming language description.

BACKGROUND OF THE INVENTION

There is considerable interest in tools that translate a programming language description of an electronic circuit into a hardware description that can be readily implemented as hardware. Presently, tools exist that are capable of translating program code written using an imperative programming language, such as C, into a hardware description language (HDL), such as the Very high-speed integrated circuit Hardware Description Language (VHDL) or VERILOG. The HDL representation of the electronic circuit can then be implemented for an integrated circuit using a standard implementation design flow. For example, the HDL representation can be synthesized, mapped, placed, and routed for a programmable logic device (PLD), such as a field programmable gate array (FPGA).

In some instances, it is desirable to use a program language description to model a hardware component having internal states, such as a state machine. Various imperative programming languages allow persistent variables. A "persistent variable" is a variable that can retain it value between difference calls to a function in which the variable is defined. For example, in the C programming language, a variable of a function can be declared as static to be persistent. A function having persistent variables can model a single instance of a hardware component having internal states.

Using a persistent variable in a trivial manner, however, does not properly model multiple instantiations of an electronic circuit. For example, to implement two instances of a hardware accumulator, two sets of states should be retained (one set for each instance). In traditional programming language semantics, however, two calls to a function designed to model an accumulator will share a single persistent variable. Accordingly, there exists a need in the art for a method and apparatus for modeling multiple instances of an electronic circuit using an imperative programming language description.

SUMMARY OF THE INVENTION

Method and apparatus for modeling multiple instances of an electronic circuit using an imperative programming language description is described. One aspect of the invention relates to modeling multiple instances of an electronic circuit using an imperative programming language function in a program. The electronic circuit includes an internal state and the imperative programming language function includes a persistent variable associated with the internal state. A first lookup table and a second lookup table are maintained throughout multiple calls to the imperative programming language function by the program. The first lookup table includes values of the persistent variable respectively associated with keys, each of the keys being defined by a call path to the imperative programming language function in the program and a name of the persistent variable. The second lookup table includes a last call path value associated with a key, the last call path variable being indicative of a last call path to the imperative programming language function in the program. The key is defined by the name of the persistent variable and a name of the imperative programming language function.

Another aspect of the invention relates to modeling multiple instances of an electronic circuit. A program is defined using an imperative programming language. The program includes multiple calls to a function. The function includes a persistent variable associated with an internal state of the electronic circuit. The function is configured to initialize the persistent variable based on at least one call path to the function in the program.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
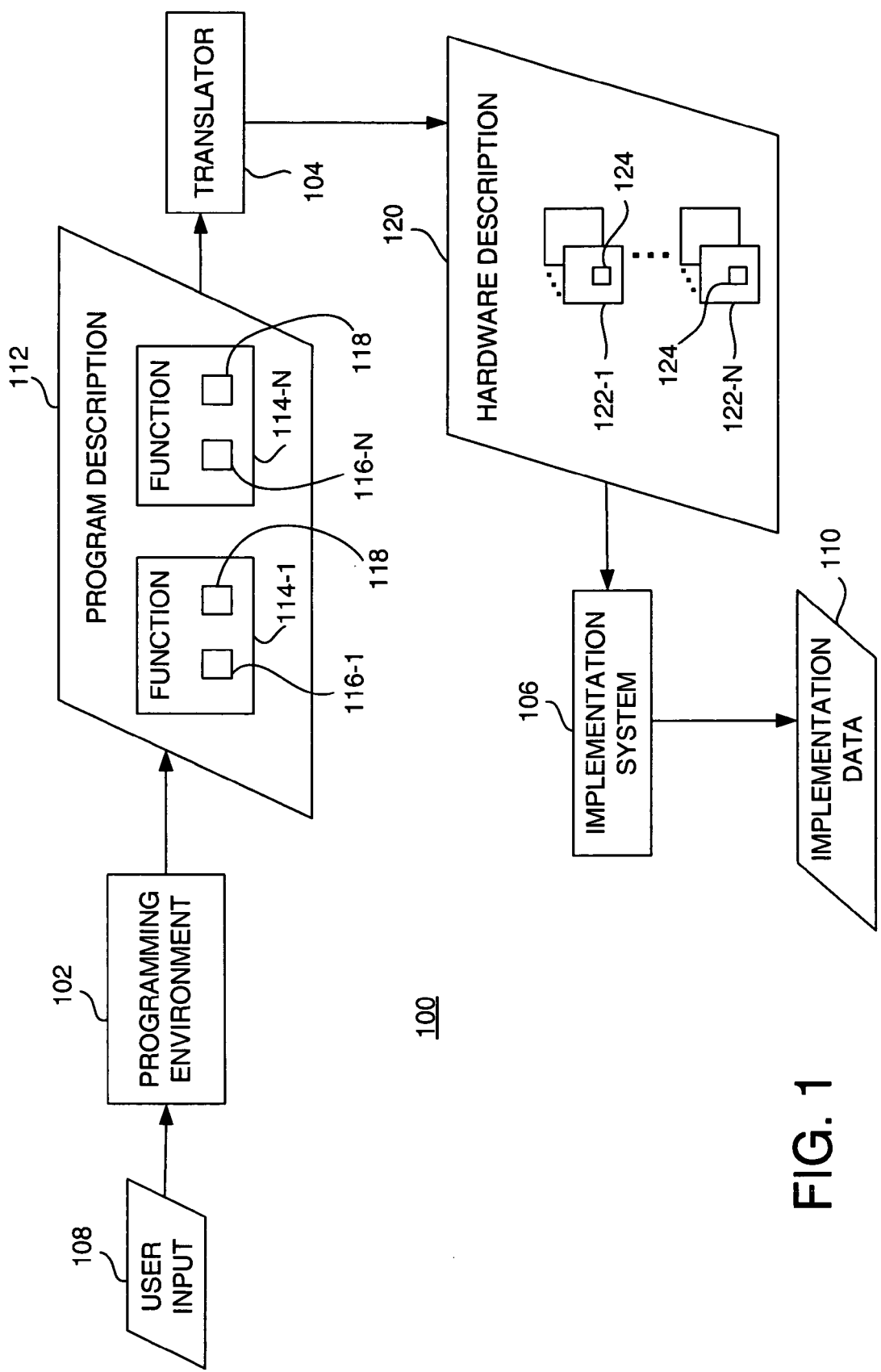
FIG. 1 is a block diagram depicting an exemplary embodiment of an integrated circuit design system constructed in accordance with one or more aspects of the invention.

FIG. 1 is a block diagram depicting an exemplary embodiment of an integrated circuit design system 100 constructed in accordance with one or more aspects of the invention. The system 100 comprises a programming environment 102, a translator 104, and an implementation system 106. The system 100 is configured to process user input 108 and produce electronic circuit implementation data 110 for an integrated circuit. For example, the system 100 may produce implementation data for a programmable logic device (PLD), such as a field programmable gate array (FPGA), a mask-programmable device, such as an application specific integrated circuit (ASIC), or like type integrated circuit devices.

In particular, the programming environment is configured to receive the user input 108. Through the user input 108, the programming environment generates a program description 112 of electronic circuitry. The program description 112 is defined using an imperative programming language, such as C, C++, JAVA, MATLAB scripting language, and like type imperative programming languages known in the art.

The program description 112 includes one or more functions 114-1 through 114-N (collectively functions 114), where N is an integer greater than zero. Each of the functions 114 is configured to model instances of an electronic circuit. For example, one function may be configured to model instances of a hardware accumulator, and another function may be configured to model instances of a hardware state machine.

Each of the functions 114-1 through 114-N respectively includes a set of persistent variables 116-1 through 116-N. Each set of persistent variables 116-1 through 116-N includes one or more persistent variables. For a given function, each of the defined persistent variables is associated with an internal state of the corresponding electronic circuit. For example, if a given function is configured to model a hardware accumulator, the function includes a persistent variable associated with the value stored in the accumulator.

Each of the functions 114 also includes an initialization portion 118. The initialization portion 118 is configured to initialize the persistent variable(s) of a function. In one embodiment, for a given persistent variable, the initialization portion 118 comprises call to an initialization function, the return value of which initializes the persistent variable. The initialization function allows each of the functions 114 to model multiple instances of an electronic circuit by maintaining separate sets of persistent variable values for different calls.

In particular, for a given function 114-x of the functions 114, each persistent variable is initialized using the initialization function. Different sets of values for the persistent variables are maintained in a table. For a given call to the function 114-x in the program description 112, a set of values for the persistent variables is selected based on the call path to the function 114-x in the program description 112. The initialization function obtains the call path from the runtime call stack accessible in the programming environment 102. As is well known in the art, the runtime call stack provides a call path to the current execution point in a program. For example, if the function 114-x is called from line A in the program description 112, then values in a set A are assigned to the persistent variables. If the function 114-x is called from line B in the program description 112, then values in a set B are assigned to the persistent variables. The call to the function 114-x in line A models on instance of an electronic circuit, and the call to the function 114-x in line B models another instance of the electronic circuit.

The initialization process of the invention may be understood with reference to the following example. Consider the following program written in the MATLAB scripting language (with line numbers added):

```
01   function [q1, q2] = testbench(d1, d2)
02     for i = 1:100
03       q1(i) = accum(d1(i));
04       q2(i) = accum(d2(i));
05     end
```

The testbench function models two instances of an accumulator through the two calls to a function named accum in lines 03 and 04, respectively. The accum function may be defined as follows:

Function q=accum(d)

persistent s, s=initialize_state(0);

q=s;

s=s+d;

The persistent variable s is initialized by a function named initialize_state, which is the initialization function. The initialization function maintains states for the accum function. A "state" is the actual persistent storage of a modeled electronic circuit instance based on the call path and persistent variable name. For example, in the testbench function, the two accum function calls share the same persistent variable, s, but the two function calls actually retain two states.

In one embodiment of the invention, the initialization function combines the call path and the persistent variable name into a unique identifier (ID) for a state. For example, by executing the testbench function, two state ID's exist. An ID "testbench/line_03_accum/s" is for persistent variable s of the first accum function call. An ID "testbench/line_4_accum/s" is for persistent variable s of the second accum function call. The initialization function maintains two look-up tables. The first table, referred to as the "global state table", stores all the state values. The values in the global state table are accessed using keys. A key to the global state table is a state ID. The second table, referred to as the "global last-call-path table", guides the storing of state values back to the global state table. A key to the global last-call-path table is the name of a function with the persistent variable name, and the corresponding value is the calling path to that function. The behavior of the initialization function may be understood with respect to FIGS. 2 and 3, described immediately below.

Figure 2:
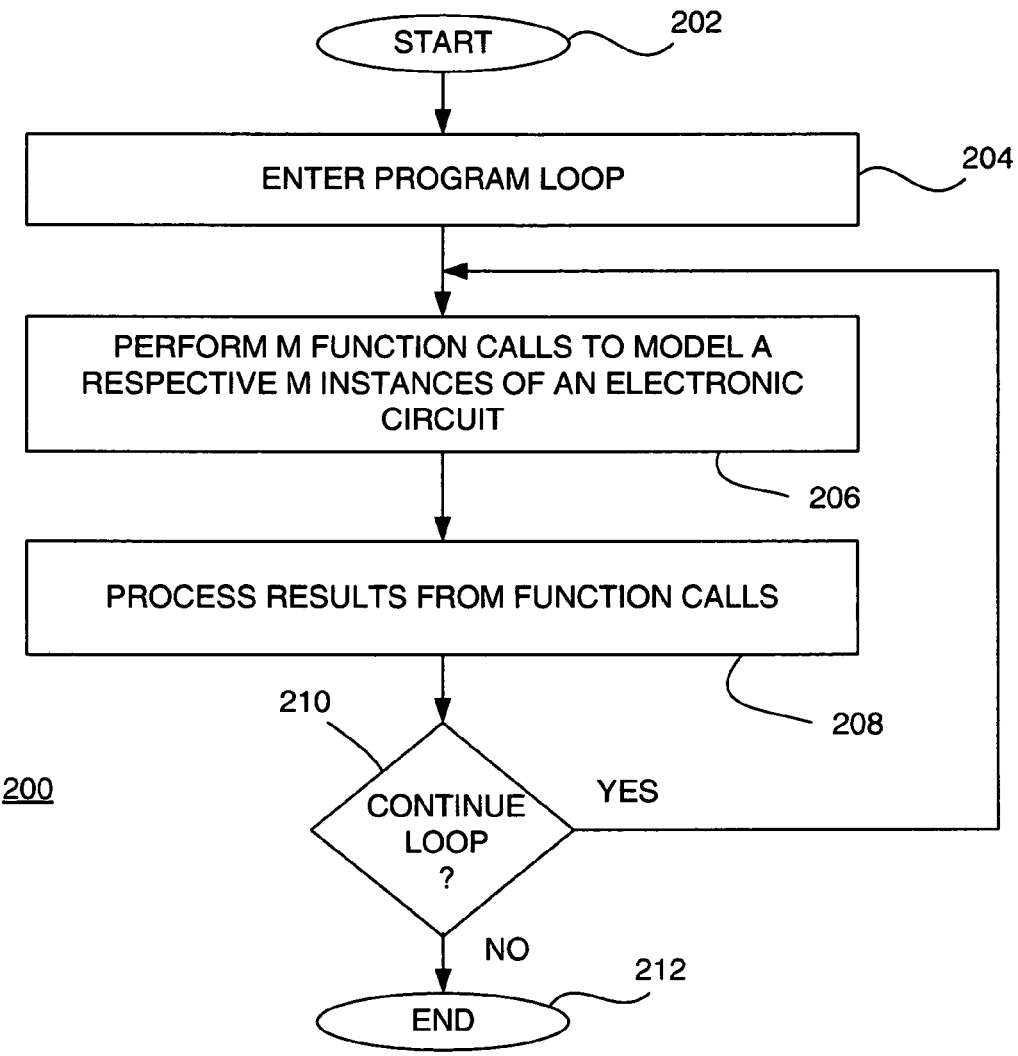
FIG. 2 is a flow diagram depicting an exemplary embodiment of a method for modeling multiple instances of an electronic circuit in accordance with one or more aspects of the invention.

FIG. 2 is a flow diagram depicting an exemplary embodiment of a method 200 for modeling multiple instances of an electronic circuit in accordance with one or more aspects of the invention. The method 200 begins at step 202. At step 204, a program loop is entered. In the above example, the testbench function includes a "for loop". Other types of program loops may be used, such as while loops, do-while loops, and the like. At step 206, M function calls are performed to model a respective M instances of an electronic circuit, where M is an integer greater than zero. In the above example, two calls to the function accum are performed for a given iteration in the testbench function to model a respective two instances of an accumulator.

At step 208, the results from the function calls are processed. In the above example, the two accum function calls return values, which are stored in arrays q1 and q2, respectively. In general, the results from the function calls may be stored and/or otherwise processed by the program in accordance with the particular electronic circuitry being modeled. At step 210, a determination is made whether to continue the program loop. If so, the method 200 returns to step 206. Otherwise, the method 200 ends at step 212.

Figure 3:
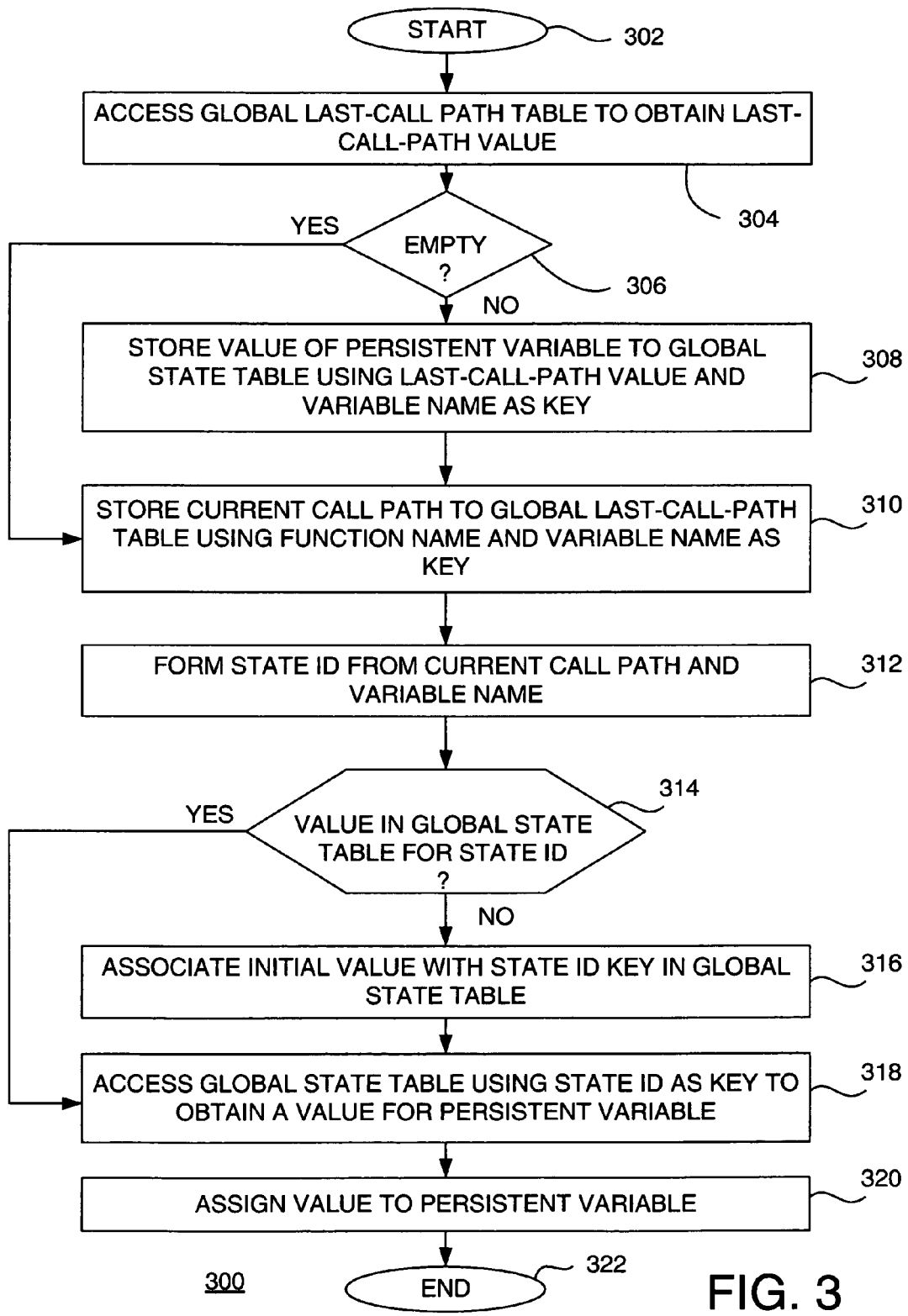
FIG. 3 is a flow diagram depicting an exemplary embodiment of a method for initializing a persistent variable in a function during a function call in accordance with one or more aspects of the invention.

FIG. 3 is a flow diagram depicting an exemplary embodiment of a method 300 for initializing a persistent variable in a function during a function call in accordance with one or more aspects of the invention. The method 300 is performed for each function call in step 206 of the method 200. Notably, the method 300 is performed by the initialization function described above. For purposes of clarity by example, the method 300 is described with respect to initialization of a single persistent variable. Those skilled in the art will appreciate that the method 300 may be performed for one or more persistent variables in a given function.

The method 300 begins at step 302. At step 304, the global last-call-path table is accessed to obtain a last-call-path value. In particular, the name of the current function of the call path and the persistent variable name are combined to form a key. The key is used to access the global last-call-path table and a value is retrieved. At step 306, a determination is made whether the value obtained is empty. If not, the method 300 proceeds to step 308.

At step 308, the value of the persistent variable is stored in the global state table using a combination of the last-call-path value obtained at step 304 and the variable name as a key. Notably, if the value retrieved from the global last-call-path table is not empty, the function has been called before and the persistent variable has been assigned with a value during the earlier call. This value is stored in the global state table so that it is not lost due to processing in the current call to the function. The method 300 then proceeds to step 310.

If, at step 306, the value obtained from the global last-call-path table is empty, the method 300 proceeds to step 310. At step 310, the current call path is stored to the global last-call-path table using a combination of the function name and the persistent variable name as a key. At step 312, a state ID is formed from a combination of the current call path and the persistent variable name. The current call path is obtained from the runtime call stack. At step 314, a determination is made whether there is a value in the global state table for the state ID formed at step 312. If not, the method 300 proceeds to step 316.

At step 316, an initial value is associated with a key corresponding to the state ID formed at step 312 in the global state table. The method 300 then proceeds to step 318. If, at step 314, there is a value in the global state table for the state ID formed at step 312, the method 300 proceeds to step 318. At step 318, the global state table is accessed using the state ID as a key to obtain a value for the persistent variable. At step 320, the value obtained at step 318 is assigned to the persistent variable. The method 300 ends at step 322.

In the above example, the execution of the method 300 for each function call proceeds as follows. The first call of the accum function in line 03 of the testbench program results in a call to the initialize_state function to initialize the persistent variable s. The global last-call-path table is accessed using the key "accum/s" and no value is obtained, since the accum function has not yet been called. The value "testbench/line__03_accum" is then stored in the global last-call-path table with the key "accum/s". The global state table is accessed using the key "testbench/line__03_accum/s" (i.e., the state ID) and no value is obtained. Thus, an initial value of zero is associated with the key "testbench/line__03_accum/s" in the global state table (the initial value is dictated by the argument of the initialize_state function). The global state table is accessed using the key "testbench/line__03_accum/s", the value of zero is obtained and returned to initialize the persistent variable s. The accum function is then performed, in which the persistent variable s is assigned the value of d1 (1).

The second call to the accum function in line 04 of the testbench program results in a call to the initialize_state function to initialize the persistent variable s. The global last-call-path table is accessed using the key "accum/s" and the value "testbench/line__03_accum" is obtained. The value of the persistent variable s (currently d1(1)) is stored in the global state table using the key "testbench/line__03_accum/s" (i.e., a combination of the last-call-path value obtained from the global last-call-path table and variable name). The value "testbench/line__04_accum" is then stored in the global last-call-path table with the key "accum/s". The global state table is accessed using the key "testbench/line__04_accum/s" (i.e., the state ID) and no value is obtained. Thus, an initial value of zero is associated with the key "testbench/line__04_accum/s" in the global state table. The global state table is accessed using the key "testbench/line__04_accum/s", the value of zero is obtained and returned to initialize the persistent variable s. The accum function is then performed, in which the persistent variable s is assigned the value of d2(1).

The program loop in the testbench program then repeats. The third call to the accum function in line 03 of the testbench program results in a call to the initialize_state function to initialize the persistent variable s. The global last-call-path table is accessed using the key "accum/s" and the value "testbench/line__04_accum" is obtained. The value of the persistent variable s (currently d2(1)) is stored in the global state table using the key "testbench/line__04_accum/s" (i.e., a combination of the last-call-path value obtained from the global last-call-path table and variable name). The value "testbench/line__03_accum" is then stored in the global last-call-path table with the key "accum/s". The global state table is accessed using the key "testbench/line__03_accum/s" (i.e., the state ID) and the value d1(1) is obtained and returned to initialize the persistent variable s. The accum function is then performed, in which the persistent variable s is assigned the value of d1(1)+d1(2).

The fourth call to the accum function in line 04 of the testbench program results in a call to the initialize_state function to initialize the persistent variable s. The global last-call-path table is accessed using the key "accum/s" and the value "testbench/line__03_accum" is obtained. The value of the persistent variable s (currently d1(1)+d1(2)) is stored in the global state table using the key "testbench/line__03_accum/s" (i.e., a combination of the last-call-path value obtained from the global last-call-path table and variable name). The value "testbench/line__04_accum" is then stored in the global last-call-path table with the key "accum/s". The global state table is accessed using the key "testbench/line__04_accum/s" (i.e., the state ID) and the value d2(1) is obtained and returned to initialize the persistent variable s. The accum function is then performed, in which the persistent variable s is assigned the value of d2(1)+d2(2).

In each of the later iterations of the for loop in the testbench program, the behavior of the initialize_state function is similar. Inside the accum call from line 03 of testbench, the initialize_state function:

1) Evaluates the persistent variable s;
2) Associates the value with the state "testbench/line__04/accum/s"; and
3) Gets the value of state "testbench/line__03_accum/s" from the global state table and returns the value.

Inside the accum call from line 04 of testbench, the initialize_state function:

1) Evaluates the persistent variable s;
2) Associates the value with the state "testbench/line__03/accum/s"; and
3) Gets the value of state "testbench/line__04_accum/s" from the global state table and returns the value.

Returning to FIG. 1, the translator 104 is configured to receive the program description 112. The translator 104 processes the program description 112 to produce a hardware description 120. The hardware description 120 may comprise one or more of an abstract description of electronic circuitry, such as a schematic representation having blocks representing electronic components and nets representing connections between components, an HDL representation, and a low level netlist description. In any case, the hardware description 120 includes sets of electronic circuit instances 122-1 through 122-N respectively associated with the functions 114-1 through 114-N. Each set of electronic circuit instances includes a plurality of instances of an electronic circuit (e.g., a plurality of accumulators). Each of the instances includes a set of internal states 124.

The implementation system 106 is configured to receive the hardware description 120. The implementation system 106 processes the hardware description 120 using a standard design flow for an integrated circuit to produce the implementation data 110. For example, for an FPGA, the implementation system 106 performs the steps of synthesis, technology mapping, placing and routing, and bitstream generation.

Implementation flows for other types of integrated circuits are well known in the art and thus omitted for clarity.

Figure 4:
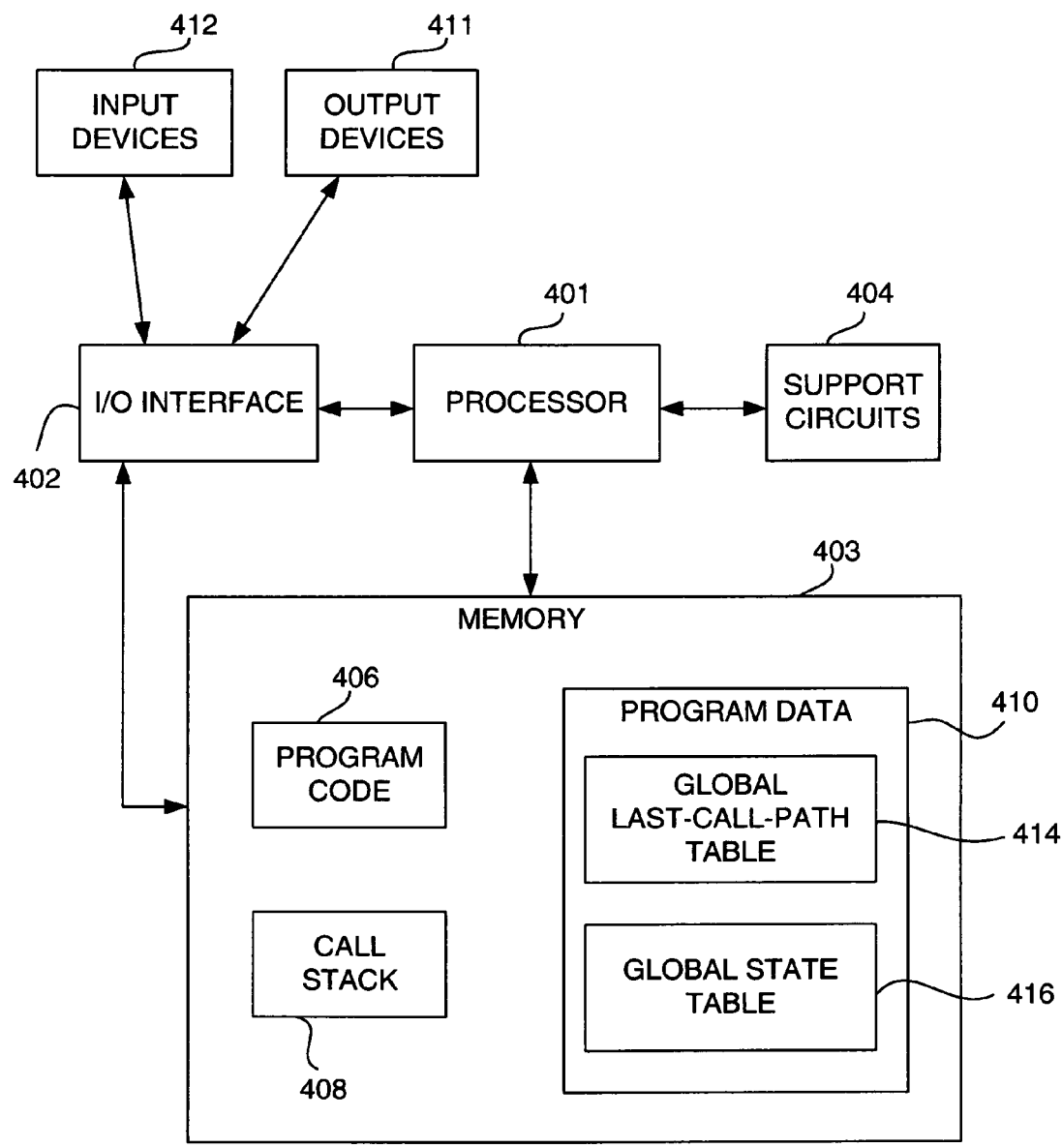
FIG. 4 is a block diagram depicting an exemplary embodiment of a computer suitable for implementing the processes and methods described herein.

FIG. 4 is a block diagram depicting an exemplary embodiment of a computer 400 suitable for implementing the processes and methods described herein. For example, the computer 400 may be used to implement the system 100 of FIG. 1, as well as the method 200 of FIG. 2 and the method 300 of FIG. 3. The computer 400 includes a processor 401, a memory 403, various support circuits 404, and an I/O interface 402. The processor 401 may be any type of microprocessor known in the art. The support circuits 404 for the processor 401 include conventional cache, power supplies, clock circuits, data registers, I/O interfaces, and the like. The I/O interface 402 may be directly coupled to the memory 403 or coupled through the processor 401. The I/O interface 402 may be coupled to various input devices 412 and output devices 411, such as a conventional keyboard, mouse, printer, display, and the like.

The memory 403 stores all or portions of one or more programs and/or data to implement the system 100 and the methods 200 and 300 described herein. Notably, the memory 403 stores program code 406 representative of the program description 112, program data 410 produced by the program code 406, and a call stack 408. The program data 410 includes a global last-call-path table 414 and a global state table 416. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 400 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 503. The memory 503 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. In a system for modeling multiple instances of an electronic circuit using an imperative programming language function in a program, said electronic circuit having an internal state, said imperative programming language function having a persistent variable associated with said internal state, a method comprising:
   maintaining, using a computer, a first lookup table and a second lookup table throughout multiple calls of said imperative programming language function by said program;
   wherein said first lookup table includes values of said persistent variable respectively associated with keys, each of said keys being defined by a call path to said imperative programming language function in said program and a name of said persistent variable;
   wherein said second lookup table includes a last call path value associated with a key, said last call path variable being indicative of a last call path to said imperative programming language function in said program, said key being defined by said name of said persistent variable and a name of said imperative programming language function;
   wherein said step of maintaining comprises, for each of said multiple calls:
      accessing said second lookup table to obtain said last call path value;
      storing a current value of said persistent variable in said first lookup table using a current key defined by said last call path value and said name of said persistent variable; and;
      updating said last call path value in said second lookup table to refer to a current call path to said imperative programming language function in said program.

2. The method of claim 1, wherein said step of maintaining further comprises, for each of said multiple calls:
   forming a new key from said current call path and said name of said persistent variable;
   determining whether said new key is associated with one of said values in said first lookup table; and
   if said new key is not associated with any of said values in said first lookup table, storing an initial value in said first lookup table using said new key.

3. The method of claim 1, wherein said step of maintaining further comprises, for each of said multiple calls:
   forming a new key from said current call path and said name of said persistent variable; and
   accessing said first lookup table using said new key to obtain a new value for said persistent variable.

4. A method of modeling multiple instances of an electronic circuit, comprising:
   defining, using a computer, a program using an imperative programming language;
   wherein said program includes multiple calls to a function, said function having a persistent variable associated with an internal state of said electronic circuit; and
   wherein said function is configured to initialize said persistent variable based on at least one call path to said function in said program and to maintain a first lookup table and a second lookup table;
   wherein said first lookup table includes values of said persistent variable respectively associated with keys, each of said keys being defined by a call path to said function in said program and a name of said persistent variable;

wherein said second lookup table includes a last call path value associated with a key, said last call path variable being indicative of a last call path to said function in said program, said key being defined by said name of said persistent variable and a name of said function; and wherein said function is further configured to, for each of said multiple calls:

access said second lookup table to obtain said last call path value;

store a current value of said persistent variable in said first lookup table using a current key defined by said last call path value and said name of said persistent variable; and update said last call path value in said second lookup table to refer to a current call path to said function in said program.

5. The method of claim 4, wherein said function is further configured to, for each of said multiple calls:

form a new key from said current call path and said name of said persistent variable;

determine whether said new key is associated with one of said values in said first lookup table; and if said new key is not associated with any of said values in said first lookup table, store an initial value in said first lookup table using said new key.

6. The method of claim 4, wherein said function is further configured to, for each of said multiple calls:

form a new key from said current call path and said name of said persistent variable; and access said first lookup table using said new key to obtain a new value for said persistent variable.

7. The method of claim 4, wherein said function is further configured to obtain said current call path from a runtime call stack.

8. The method of claim 4, further comprising:

generating a hardware description language representation of said multiple instances of said electronic circuit from said program.

9. The method of claim 8, further comprising:

generating an implementation of said multiple instances of electronic circuit for an integrated circuit using said hardware description language representation.

10. Apparatus for modeling multiple instances of an electronic circuit, comprising:

a computer configured to define a program using an imperative programming language;

wherein said program includes multiple calls to a function, said function having a persistent variable associated with an internal state of said electronic circuit;

wherein said function is configured to initialize said persistent variable based on at least one call path to said function in said program and to maintain a first lookup table and a second lookup table;

wherein said first lookup table includes values of said persistent variable respectively associated with keys, each of said keys being defined by a call path to said function in said program and a name of said persistent variable;

wherein said second lookup table includes a last call path value associated with a key, said last call path variable being indicative of a last call path to said function in said program, said key being defined by said name of said persistent variable and a name of said function; and wherein said function is further configured to, for each of said multiple calls:

access said second lookup table to obtain said last call path value;

store a current value of said persistent variable in said first lookup table using a current key defined by said last call path value and said name of said persistent variable; and update said last call path value in said second lookup table to refer to a current call path to said function in said program.

11. The apparatus of claim 10, wherein said function is further configured to, for each of said multiple calls:

form a new key from said current call path and said name of said persistent variable;

determine whether said new key is associated with one of said values in said first lookup table; and if said new key is not associated with any of said values in said first lookup table, store an initial value in said first lookup table using said new key.

12. The apparatus of claim 10, wherein said function is further configured to, for each of said multiple calls:

form a new key from said current call path and said name of said persistent variable; and access said first lookup table using said new key to obtain a new value for said persistent variable.

13. The apparatus of claim 10, wherein said function is further configured to obtain said current call path from a runtime call stack.

14. The apparatus of claim 10, wherein said computer is further configured to:

generate a hardware description language representation of said multiple instances of said electronic circuit from said program.

15. The apparatus of claim 14, wherein said computer is further configured to:

generate an implementation of said multiple instances of said electronic circuit for an integrated circuit using said hardware description language representation.

* * * * *